(12) United States Patent
Marimuthu et al.

(10) Patent No.: US 9,842,775 B2
(45) Date of Patent: Dec. 12, 2017

(54) SEMICONDUCTOR DEVICE AND METHOD OF FORMING A THIN WAFER WITHOUT A CARRIER

(71) Applicant: STATS ChipPAC Pte. Ltd., Singapore (SG)

(72) Inventors: Pandi C. Marimuthu, Singapore (SG); Shuangwu Huang, Singapore (SG); Nathapong Suthiwongsunthorn, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/218,536

(22) Filed: Jul. 25, 2016

(65) Prior Publication Data

US 2016/0336230 A1     Nov. 17, 2016

Related U.S. Application Data

(60) Division of application No. 13/933,406, filed on Jul. 2, 2013, now Pat. No. 9,443,762, which is a
(Continued)

(51) Int. Cl.
*H01L 21/768* (2006.01)
*H01L 21/56* (2006.01)
(Continued)

(52) U.S. Cl.
CPC ...... *H01L 21/76898* (2013.01); *H01L 21/302* (2013.01); *H01L 21/56* (2013.01);
(Continued)

(58) Field of Classification Search
CPC ......... H01L 21/76898; H01L 21/76885; H01L 21/302; H01L 21/561; H01L 23/3114; H01L 23/481
See application file for complete search history.

(56) References Cited

U.S. PATENT DOCUMENTS

| | | | |
|---|---|---|---|
| 5,618,752 | A | 4/1997 | Gaul |
| 6,534,723 | B1 | 3/2003 | Asai et al. |

(Continued)

FOREIGN PATENT DOCUMENTS

| | | |
|---|---|---|
| CN | 101315924 A | 12/2008 |
| TW | 200820412 A | 5/2008 |
| TW | 200832645 A | 8/2008 |

*Primary Examiner* — Nathan W Ha
(74) *Attorney, Agent, or Firm* — Robert D. Atkins; Patent Law Group: Atkins and Associates, P.C.

(57) ABSTRACT

A semiconductor device has a conductive via in a first surface of a substrate. A first interconnect structure is formed over the first surface of the substrate. A first bump is formed over the first interconnect structure. The first bump is formed over or offset from the conductive via. An encapsulant is deposited over the first bump and first interconnect structure. A portion of the encapsulant is removed to expose the first bump. A portion of a second surface of the substrate is removed to expose the conductive via. The encapsulant provides structural support and eliminates the need for a separate carrier wafer when thinning the substrate. A second interconnect structure is formed over the second surface of the substrate. A second bump is formed over the first bump. A plurality of semiconductor devices can be stacked and electrically connected through the conductive via.

16 Claims, 13 Drawing Sheets

Related U.S. Application Data continuation of application No. 12/412,279, filed on Mar. 26, 2009, now Pat. No. 8,531,015.

(51) Int. Cl.

| | | |
|---|---|---|
| *H01L 23/31* | (2006.01) | |
| *H01L 23/48* | (2006.01) | |
| *H01L 23/00* | (2006.01) | |
| *H01L 25/10* | (2006.01) | |
| *H01L 23/498* | (2006.01) | |
| *H01L 21/302* | (2006.01) | |
| *H01L 25/065* | (2006.01) | |

(52) U.S. Cl.
CPC ...... *H01L 21/561* (2013.01); *H01L 21/76885* (2013.01); *H01L 23/3114* (2013.01); *H01L 23/481* (2013.01); *H01L 23/49811* (2013.01); *H01L 24/02* (2013.01); *H01L 24/04* (2013.01); *H01L 24/05* (2013.01); *H01L 24/06* (2013.01); *H01L 24/10* (2013.01); *H01L 24/11* (2013.01); *H01L 24/12* (2013.01); *H01L 24/13* (2013.01); *H01L 24/14* (2013.01); *H01L 24/16* (2013.01); *H01L 25/0657* (2013.01); *H01L 25/105* (2013.01); *H01L 24/48* (2013.01); *H01L 2224/02166* (2013.01); *H01L 2224/02181* (2013.01); *H01L 2224/0391* (2013.01); *H01L 2224/0401* (2013.01); *H01L 2224/0557* (2013.01); *H01L 2224/05083* (2013.01); *H01L 2224/05572* (2013.01); *H01L 2224/06181* (2013.01); *H01L 2224/10125* (2013.01); *H01L 2224/1184* (2013.01); *H01L 2224/11901* (2013.01); *H01L 2224/1301* (2013.01); *H01L 2224/13009* (2013.01); *H01L 2224/13025* (2013.01); *H01L 2224/13027* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2224/14104* (2013.01); *H01L 2224/14181* (2013.01); *H01L 2224/48* (2013.01); *H01L 2224/73265* (2013.01); *H01L 2225/06513* (2013.01); *H01L 2225/06541* (2013.01); *H01L 2225/1058* (2013.01); *H01L 2924/0002* (2013.01); *H01L 2924/00013* (2013.01); *H01L 2924/00014* (2013.01); *H01L 2924/0103* (2013.01); *H01L 2924/014* (2013.01); *H01L 2924/01013* (2013.01); *H01L 2924/01022* (2013.01); *H01L 2924/01023* (2013.01); *H01L 2924/01024* (2013.01); *H01L 2924/01029* (2013.01); *H01L 2924/01046* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04941* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15174* (2013.01); *H01L 2924/181* (2013.01); *H01L 2924/182* (2013.01); *H01L 2924/1815* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | |
|---|---|---|
| 6,774,467 B2 | 8/2004 | Horiuchi et al. |
| 7,049,170 B2 | 5/2006 | Savastiouk et al. |
| 7,141,487 B2 | 11/2006 | Periasamy et al. |
| 7,348,262 B2 | 3/2008 | Lee et al. |
| 7,470,998 B2 | 12/2008 | Okumura et al. |
| 7,485,562 B2 | 2/2009 | Chua et al. |
| 7,759,582 B2 | 7/2010 | Takahashi et al. |
| 8,487,444 B2 | 7/2013 | Law et al. |
| 8,736,050 B2 | 5/2014 | Huang et al. |
| 8,741,762 B2 | 6/2014 | Liu et al. |
| 8,749,066 B2 | 6/2014 | Zhang et al. |
| 8,779,593 B2 | 7/2014 | Ogata |
| 2004/0031973 A1 | 2/2004 | Cognetti et al. |
| 2004/0070064 A1 | 4/2004 | Yamane et al. |
| 2005/0116337 A1 | 6/2005 | Chua et al. |
| 2006/0012005 A1 | 1/2006 | Leib et al. |
| 2006/0014320 A1 | 1/2006 | Yamano et al. |
| 2006/0060961 A1 | 3/2006 | Lin et al. |
| 2007/0023886 A1 | 2/2007 | Hedler et al. |
| 2007/0023888 A1 | 2/2007 | Fujii |
| 2008/0185729 A1 | 8/2008 | Yamaguchi et al. |
| 2008/0203526 A1 | 8/2008 | Mihara |
| 2008/0237879 A1 | 10/2008 | Yang |
| 2008/0237884 A1 | 10/2008 | Hsu |
| 2008/0258285 A1 | 10/2008 | Harper et al. |
| 2008/0296763 A1 | 12/2008 | Chen et al. |
| 2008/0315433 A1 | 12/2008 | Chen et al. |
| 2009/0023281 A1 | 1/2009 | Imafuji et al. |
| 2009/0057913 A1 | 3/2009 | Hsu |
| 2009/0102021 A1 | 4/2009 | Chen et al. |
| 2009/0149023 A1* | 6/2009 | Koyanagi ......... H01L 21/76898 438/666 |
| 2009/0212429 A1 | 8/2009 | Do et al. |
| 2010/0072579 A1 | 3/2010 | Thies et al. |
| 2010/0102453 A1* | 4/2010 | Tseng ............... H01L 21/76898 257/774 |
| 2010/0117208 A1* | 5/2010 | Kim ................. H01L 21/76898 257/684 |
| 2010/0140815 A1 | 6/2010 | Marimuthu et al. |
| 2010/0224966 A1 | 9/2010 | Chen |
| 2012/0074584 A1 | 3/2012 | Lee et al. |
| 2013/0105213 A1 | 5/2013 | Hu et al. |
| 2015/0129285 A1 | 5/2015 | Hu et al. |

* cited by examiner

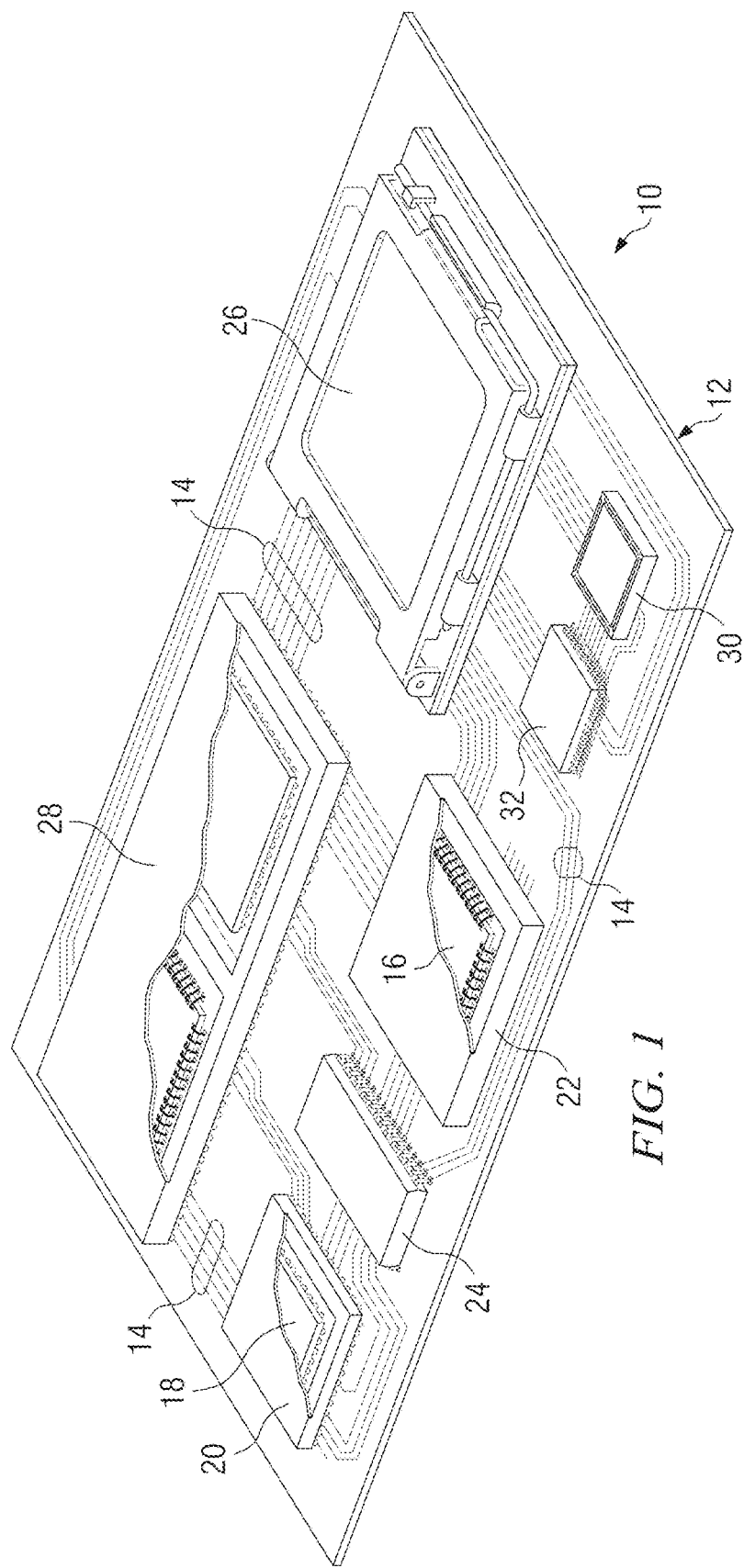

SEMICONDUCTOR DEVICE AND METHOD OF FORMING A THIN WAFER WITHOUT A CARRIER

CLAIM TO DOMESTIC PRIORITY

The present application is a division of U.S. patent application Ser. No. 13/933,406, now U.S. Pat. No. 9,443,762, filed Jul. 2, 2013, which is a continuation of U.S. patent application Ser. No. 12/412,279, now U.S. Pat. No. 8,531,015, filed Mar. 26, 2009, which applications are incorporated herein by reference.

FIELD OF THE INVENTION

The present invention relates in general to semiconductor devices and, more particularly, to a semiconductor device and method of forming a thin semiconductor wafer without a carrier.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, semiconductor wafers are made as thin as possible to reduce package height. To reduce substrate thickness, the back surface of the wafer undergoes a thinning process such as back grinding or CMP. The thin wafer is susceptible to cracking and breakage during handling and manufacturing processes. To reduce the potential for damage, a carrier wafer is typically affixed to the thin wafer to provide additional structural support. The carrier wafer is removed after the manufacturing process. The need for a carrier wafer adds manufacturing complexity of process and cost.

SUMMARY OF THE INVENTION

A need exists to form a thin semiconductor substrate without a carrier. Accordingly, in one embodiment, the present invention is a method of making a semiconductor device comprising the steps of providing a semiconductor die, forming a conductive via partially through the semiconductor die, forming a first interconnect structure over a first surface of the semiconductor die, forming a first bump over the first interconnect structure, depositing an encapsulant over the first surface of the semiconductor die, and removing a portion of the semiconductor die to expose the conductive via.

In another embodiment, the present invention is a method of making a semiconductor device comprising the steps of providing a substrate, forming a conductive via partially through the substrate, forming a first bump over a first surface of the substrate, depositing an encapsulant over the first surface of the substrate, and removing a portion of the substrate to expose the conductive via.

In another embodiment, the present invention is a method of making a semiconductor device comprising the steps of providing a substrate, forming a conductive via partially through the substrate, forming a first interconnect structure over a first surface of the substrate, removing a portion of the substrate to expose the conductive via, and forming a second interconnect structure over a second surface of the substrate opposite the first surface of the substrate.

In another embodiment, the present invention is a method of making a semiconductor device comprising the steps of providing a substrate, forming a conductive via in a first surface of the substrate, forming a first interconnect structure over the first surface of the substrate, forming a bump over the first interconnect structure, and depositing an encapsulant over the first interconnect structure and bump.

BRIEF DESCRIPTION OF THE DRAWINGS

FIG. 1 illustrates a printed circuit board (PCB) with different types of packages mounted to its surface;

DETAILED DESCRIPTION OF THE DRAWINGS

Figure 2A:
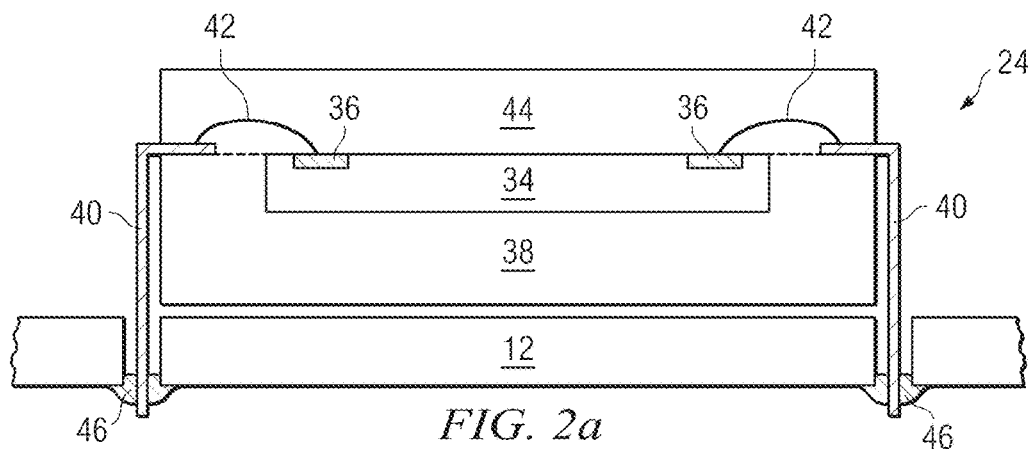
FIGS. 2a-2c illustrate further detail of the representative semiconductor packages mounted to the PCB.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
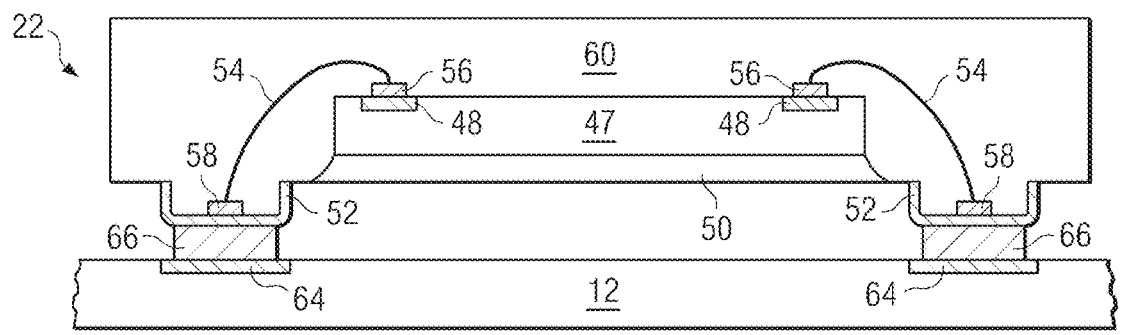

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
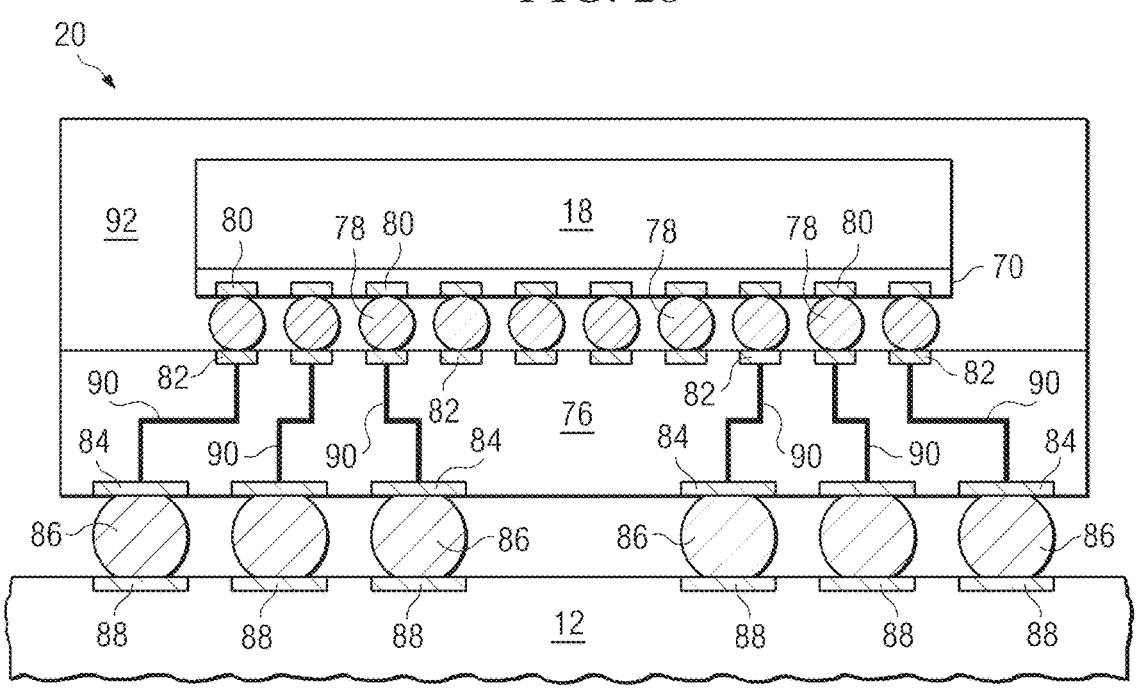

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3A:
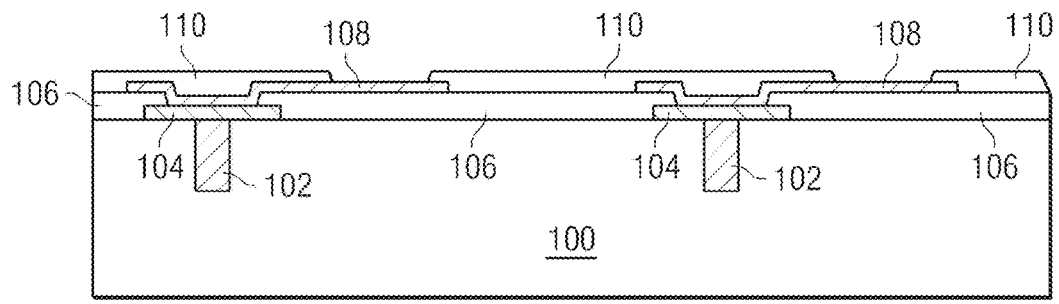
FIGS. 3a-3h illustrate a process of forming a thin semiconductor substrate without a carrier.

FIGS. 3a-3h show a process of forming a thin semiconductor wafer or substrate without a carrier. In FIG. 3a, a substrate or wafer 100 is made with a semiconductor base material such as silicon, germanium, gallium arsenide, indium phosphide, or silicon carbide. In one embodiment, semiconductor wafer 100 is about 30.5 centimeters (cm) in diameter. One or more semiconductor die, as described above, are formed on or mounted to substrate 100. Each semiconductor die includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement analog circuits or baseband digital circuits, such as digital signal processor (DSP), memory, or other signal processing circuit. The semiconductor die may also contain IPD, such as inductors, capacitors, and resistors, for RF signal processing.

A plurality of through silicon via (TSV) 102 is formed in a front surface of substrate 100 by etching or drilling a via through the silicon material of the substrate to a depth of 30-300 micrometers (μm). The via is filled with Al, Cu, Sn, Ni, Au, Ag, titanium (Ti), W, poly-silicon, or other suitable electrically conductive material using PVD, CVD, electrolytic plating, electroless plating process, or other suitable metal deposition process.

An electrically conductive layer 104 is patterned and deposited over substrate 100 and conductive TSV 102. Conductive layer 104 can be one or more layers of Al, Cu, Sn, Ni, Au, Ag, or other suitable electrically conductive material. Conductive layer 104 is formed using PVD, CVD, electrolytic plating, electroless plating process, or other suitable metal deposition process. Conductive layer 104 is a metal pad having electrical connection to the active and passive devices, IPDs, and conductive layers disposed in the semiconductor die. Conductive layer 104 electrically contacts conductive TSV 102.

A dielectric or insulating layer 106 is formed over substrate 100 and conductive layer 104. The dielectric layer 106 can be one or more layers of silicon dioxide (SiO2), silicon nitride (Si3N4), silicon oxynitride (SiON), tantalum pentoxide (Ta2O5), zircon (ZrO2), aluminum oxide (Al2O3), polyimide, benzocyclobutene (BCB), polybenzoxazoles (PBO), or other material having suitable electrical insulating properties. The dielectric layer 106 is patterned or blanket deposited using PVD, CVD, printing, spin coating, sintering, or thermal oxidation. A portion of dielectric layer 106 is removed by an etching process to expose conductive layer 104.

An electrically conductive layer 108 is patterned and deposited over dielectric layer 106 and conductive layer 104. Conductive layer 108 can be one or more layers of Al, Cu, Sn, Ni, Au, Ag, or other suitable electrically conductive material. Conductive layer 108 is formed using PVD, CVD, electrolytic plating, electroless plating process, or other suitable metal deposition process. Conductive layer 108 operates as a runner or redistribution layer (RDL) to extend the interconnectivity of conductive layer 104.

A passivation or insulating layer 110 is formed over dielectric layer 106 and conductive layer 108. The passivation layer 110 can be one or more layers of SiO2, Si3N4, SiON, Ta2O5, Al2O3, or other material having insulating and structural properties. The passivation layer 110 is patterned or blanket deposited using PVD, CVD, printing, spin coating, sintering, or thermal oxidation. A portion of passivation layer 110 is removed by an etching process to expose conductive layer 108.

Figure 3B:
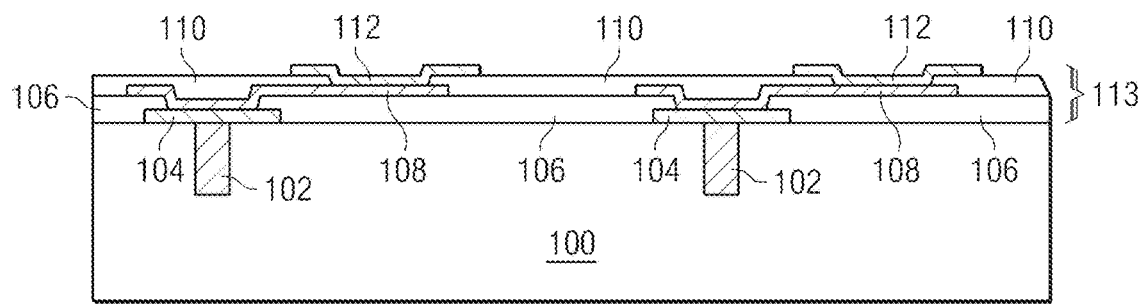

In FIG. 3b, an electrically conductive layer 112 is patterned and deposited over passivation layer 110 and conductive layer 108. Conductive layer 112 can be one or more layers of Al, Cu, Sn, Ni, Au, Ag, or other suitable electrically conductive material. Conductive layer 112 is formed using PVD, CVD, electrolytic plating, electroless plating process, or other suitable metal deposition process. Conductive layer 112 operates as an under bump metallization layer (UBM) or bump pad for conductive layer 108. UBM 112 can be a multi-metal stack with adhesion layer, barrier layer, and seed or wetting layer. The adhesion layer is formed over conductive layer 108 and can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 108 and subsequent bumps or other interconnect structure. UBM 112 provides a low resistive interconnect to conductive layer 108, as well as a barrier to solder diffusion and seed layer for solder wettability.

The combination of conductive layers 104 and 108, UBM 112, and insulating layers 106 and 110 constitute a front side interconnect structure 113.

Figure 3C:
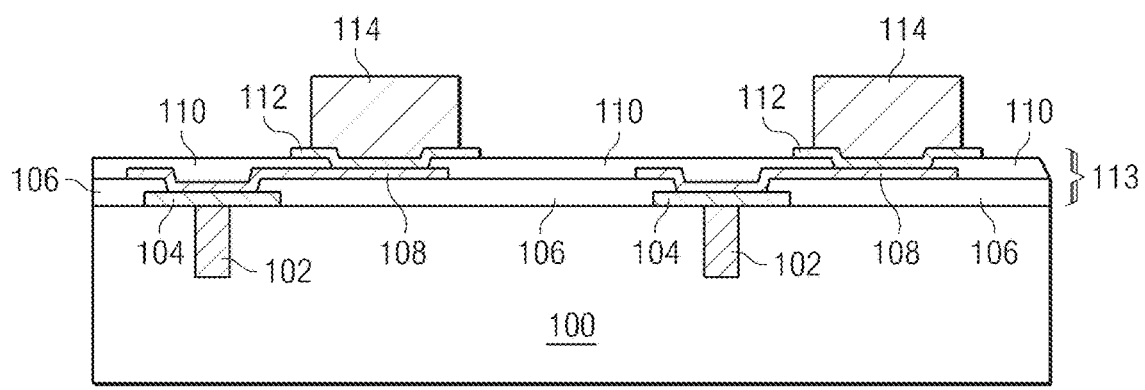

In FIG. 3c, an electrically conductive material is deposited over UBM 112 to form bumps 114 using an evaporation, electrolytic plating, electroless plating, ball drop, or screen printing process. The conductive material can be any metal such as Sn, Ni, Au, Ag, Pb, Bi, and alloys thereof, with an optional flux material.

Figure 3D:
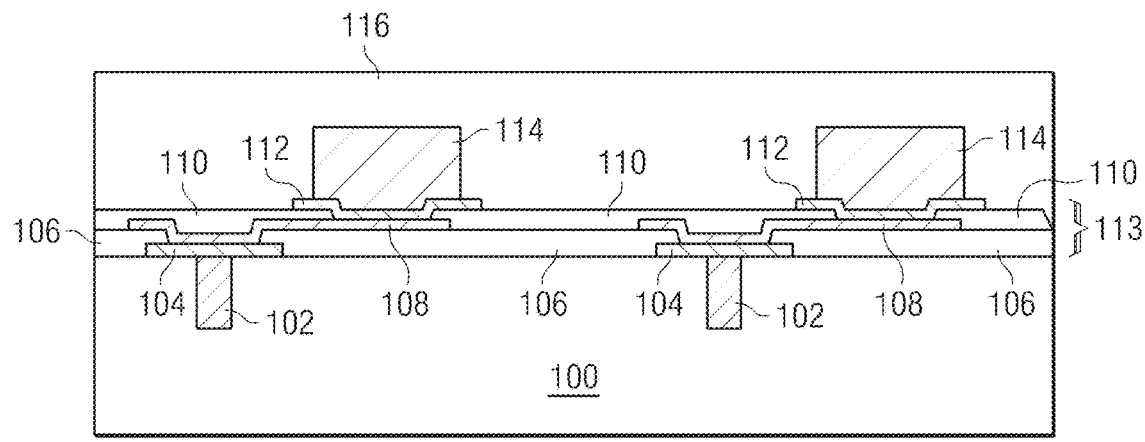

FIG. 3d shows an encapsulant or molding compound 116 deposited over passivation layer 110 and bumps 114 using a paste printing, compressive molding, transfer molding, liquid encapsulant molding, vacuum lamination, or other suitable applicator. Encapsulant 116 can be polymer composite material, such as epoxy resin with filler, epoxy acrylate with filler, or polymer with proper filler. Encapsulant 116 is non-conductive and environmentally protects the semiconductor device from external elements and contaminants.

Figure 3E:
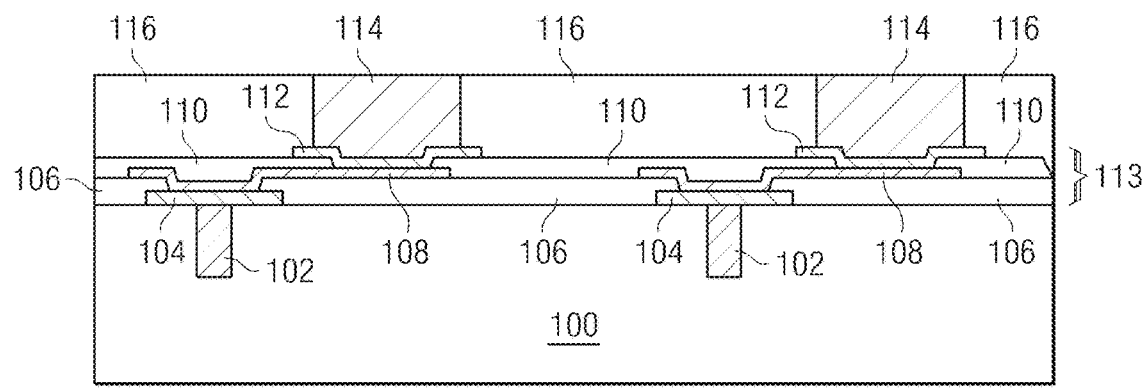

In FIG. 3e, a portion of encapsulant 116 is removed by CMP, mechanical grinding, plasma etching, wet etch, dry etch, or another thinning process to expose bumps 114.

Figure 3F:
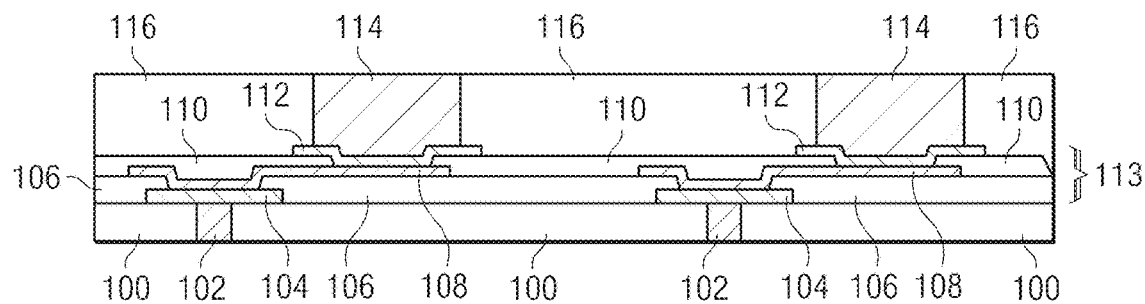
Figure 3G:
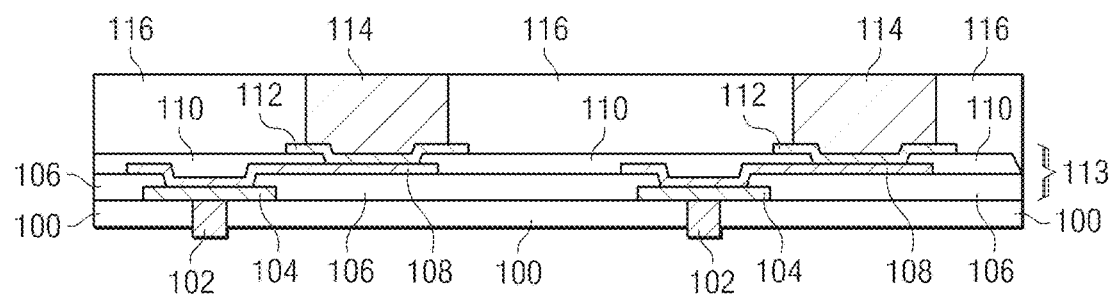

In FIG. 3f, a portion of a back surface of substrate 100 is removed to expose conductive TSV 102. The silicon or other base semiconductor material 100 can be removed by CMP, mechanical grinding, plasma etching, wet etch, dry etch, or another thinning process. A back grinding tape can be used for structural support during the thinning process. The remaining portion of substrate 100 is relatively thin, having a thickness less than 100 micrometers (μm). Encapsulant 116 provides structural support for the thin substrate 100 during the thinning process, as well as later handling and processing. Encapsulant 116 eliminates the need for a separate wafer carrier. FIG. 3g shows another embodiment with conductive TSV 102 extending or protruding from the back surface of substrate 100 after the thinning process.

Figure 3H:
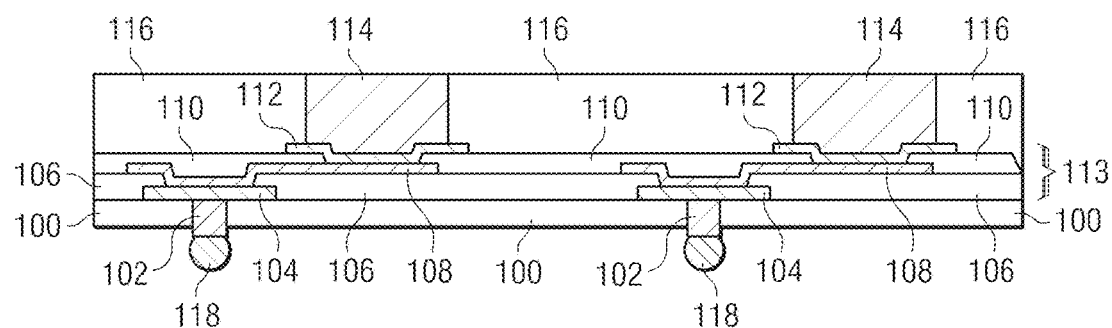

In FIG. 3h, an electrically conductive material is deposited over conductive TSV 102 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 118. In some applications, bumps 118 are reflowed a second time to improve electrical contact to conductive TSV 102. Bumps 118 represent one type of interconnect structure that can be formed over conductive TSV 102. The interconnect structure can also use bond wires, 3-D interconnects, stud bump, micro bump, or other electrical interconnect.

Figure 4:
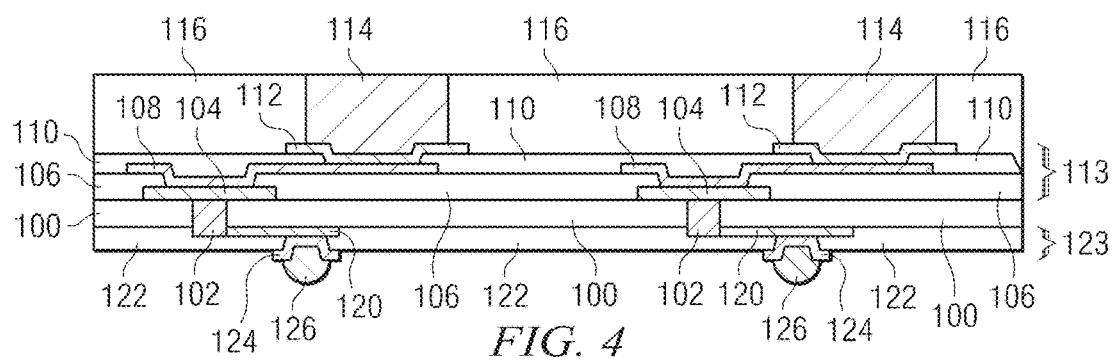
FIG. 4 illustrates forming RDL and bumps on a back surface of the thin substrate.

FIG. 4 shows another embodiment with an electrically conductive layer 120 patterned and deposited over the back surface of substrate 100. Conductive layer 120 can be one or more layers of Al, Cu, Sn, Ni, Au, Ag, or other suitable electrically conductive material. Conductive layer 120 is formed using PVD, CVD, electrolytic plating, electroless plating process, or other suitable metal deposition process. Conductive layer 120 operates as a runner or RDL to extend the interconnectivity of conductive TSV 102.

A passivation or insulating layer 122 is formed over the back surface of substrate 100, TSV 102, and conductive layer 120. The passivation layer 122 can be one or more layers of SiO2, Si3N4, SiON, Ta2O5, Al2O3, or other material having insulating and structural properties. The passivation layer 122 is patterned or blanket deposited using PVD, CVD, printing, spin coating, sintering, or thermal oxidation. A portion of passivation layer 122 is removed by an etching process to expose conductive layer 120.

An electrically conductive layer 124 is patterned and deposited over passivation layer 122 and conductive layer 120. Conductive layer 124 can be one or more layers of Al, Cu, Sn, Ni, Au, Ag, or other suitable electrically conductive material. Conductive layer 124 is formed using PVD, CVD, electrolytic plating, electroless plating process, or other suitable metal deposition process. Conductive layer 124 operates as a UBM or bump pad for conductive layer 120.

The combination of conductive layer 120, UBM 124, and insulating layer 122 constitute a back side interconnect structure 123.

An electrically conductive material is deposited over UBM 124 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 126. In some applications, bumps 126 are reflowed a second time to improve electrical contact to UBM 124. Bumps 126 represent one type of interconnect structure that can be formed over UBM 124. The interconnect structure can also use bond wires, 3-D interconnects, stud bump, micro bump, or other electrical interconnect.

Figure 5:
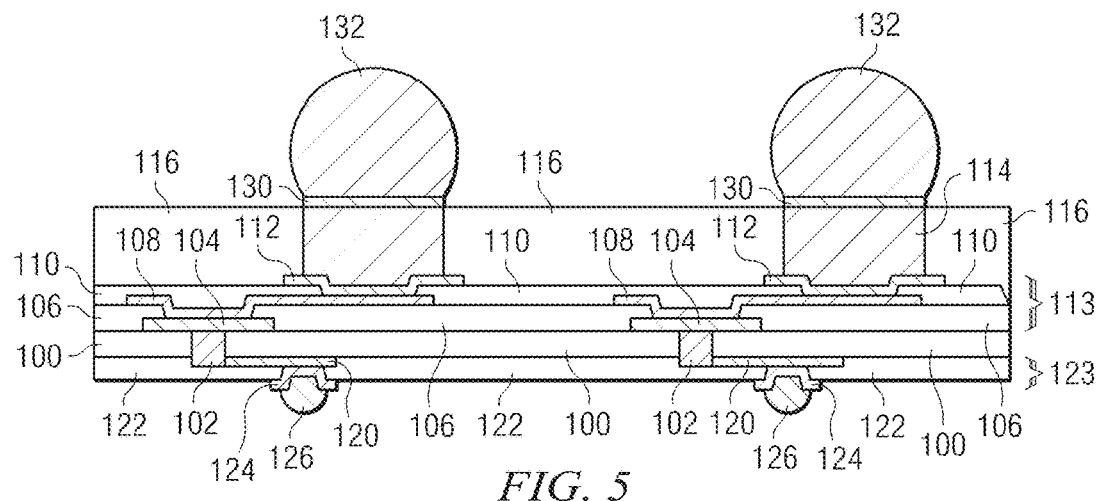
FIG. 5 illustrates forming UBM and bumps on a front surface of the thin substrate.

In FIG. 5, an electrically conductive layer 130 is patterned and deposited over bump 114. Conductive layer 130 can be one or more layers of Al, Cu, Sn, Ni, Au, Ag, or other suitable electrically conductive material. Conductive layer 130 is formed using PVD, CVD, electrolytic plating, electroless plating process, or other suitable metal deposition process. Conductive layer 130 operates as a UBM or bump pad for bump 114.

An electrically conductive material is deposited over UBM 130 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 132. In some applications, bumps 132 are reflowed a second time to improve electrical contact to UBM 130. Bumps 132 represent one type of interconnect structure that can be formed over UBM 130 and bumps 114. The interconnect structure can also use bond wires, 3-D interconnects, stud bump, micro bump, or other electrical interconnect.

An alternate process of forming the thin semiconductor substrate without a carrier is shown in FIGS. 6a-6e. From the structure set forth in FIGS. 3a and 3b, an electrically conductive material is deposited over UBM 112 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 136. In some applications, bumps 136 are reflowed a second time to improve electrical contact to UBM 112.

Figure 6A:
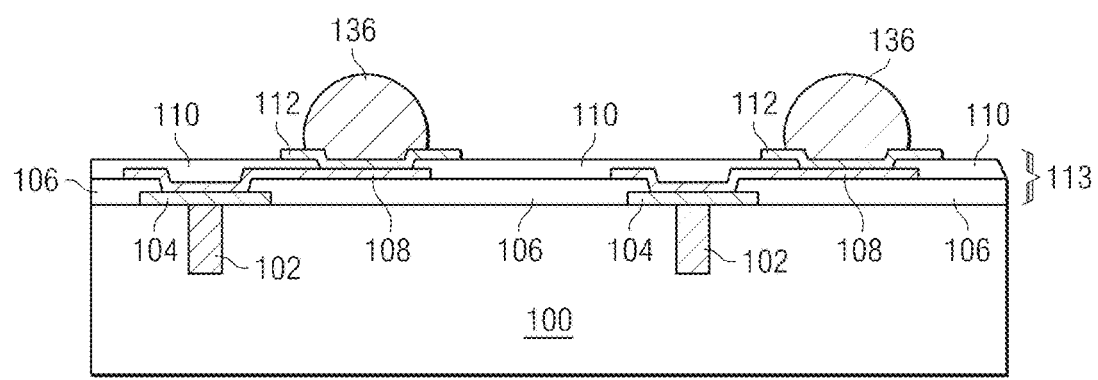
FIGS. 6a-6e illustrate an alternate process of forming a thin semiconductor substrate without a carrier using bumps on the front surface.
Figure 6B:
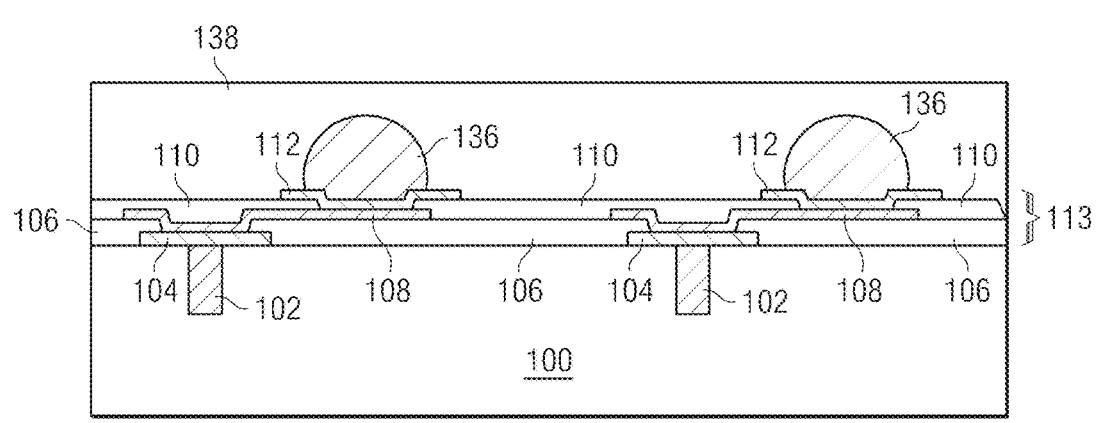

FIG. 6b shows an encapsulant or molding compound 138 deposited over passivation layer 110 and bumps 136 using a paste printing, compressive molding, transfer molding, liquid encapsulant molding, vacuum lamination, or other suitable applicator. Encapsulant 138 can be polymer composite material, such as epoxy resin with filler, epoxy acrylate with filler, or polymer with proper filler. Encapsulant 138 is non-conductive and environmentally protects the semiconductor device from external elements and contaminants.

Figure 6C:
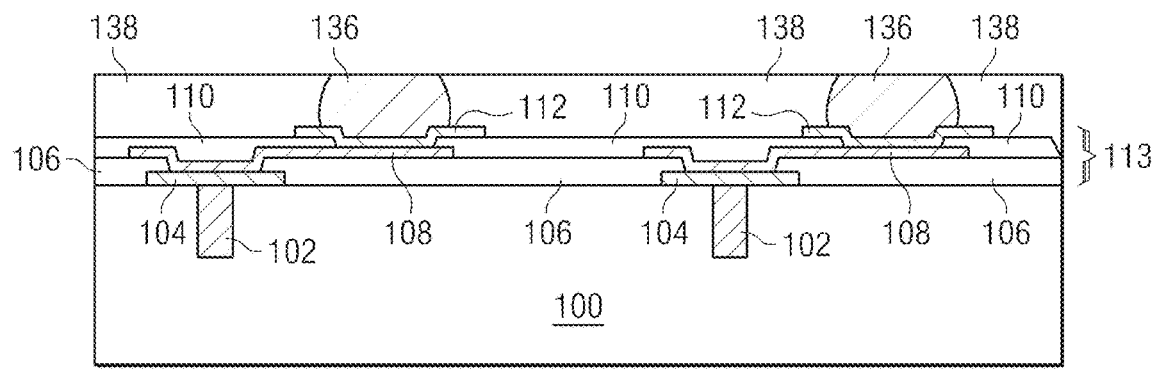

In FIG. 6c, a portion of encapsulant 138 is removed by CMP, mechanical grinding, plasma etching, wet etch, dry etch, or another thinning process to expose bumps 136.

Figure 6D:
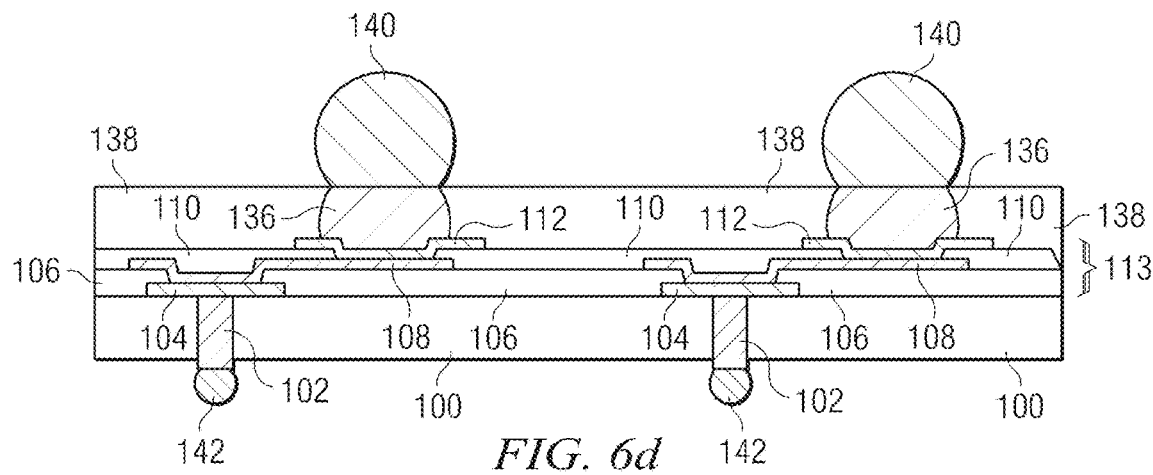

In FIG. 6d, a portion of substrate 100 is removed to expose conductive TSV 102. The silicon or other base semiconductor material 100 can be removed by CMP, mechanical grinding, plasma etching, wet etch, dry etch, or another thinning process. A back grinding tape can be used for structural support during the thinning process. The remaining portion of substrate 100 is relatively thin, having a thickness less than 100 μm. Encapsulant 138 provides structural support for the thin substrate 100 during the thinning process, as well as later handling and processing. Encapsulant 138 eliminates the need for a separate wafer carrier.

An electrically conductive material is deposited over bump 136 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 140.

In some applications, bumps 140 are reflowed a second time to improve electrical contact to bumps 136. Bumps 140 represent one type of interconnect structure that can be formed over bumps 136. The interconnect structure can also use bond wires, 3-D interconnects, stud bump, micro bump, or other electrical interconnect.

An electrically conductive material is deposited over conductive TSV 102 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 142. In some applications, bumps 142 are reflowed a second time to improve electrical contact to conductive TSV 102. Bumps 142 represent one type of interconnect structure that can be formed over conductive TSV 102. The interconnect structure can also use bond wires, 3-D interconnects, stud bump, micro bump, or other electrical interconnect.

Figure 6E:
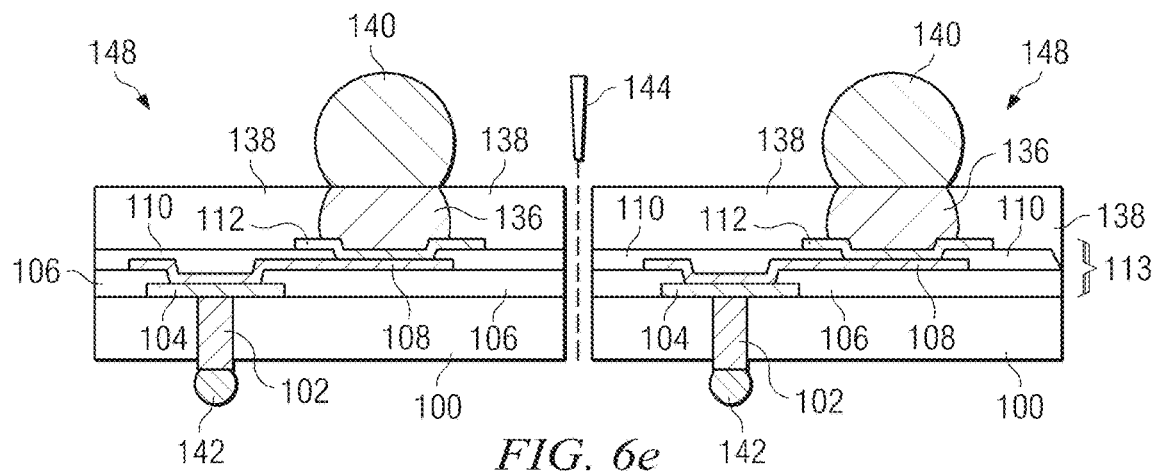

Semiconductor substrate 100 is singulated in FIG. 6e using a laser cutting device or saw blade 144 into individual semiconductor packages 148. The vertical interconnect structure through semiconductor package 148 includes conductive layers 104 and 108, UBM 112, conductive TSV 102, and bumps 136, 140, and 142.

Figure 7A:
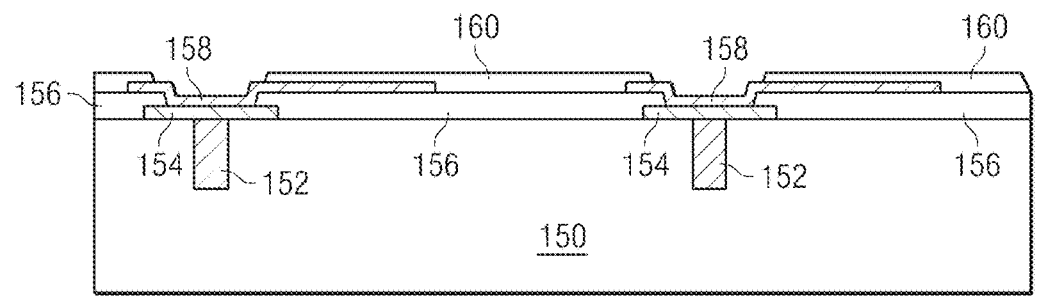
FIGS. 7a-7h illustrate another process of forming a thin semiconductor substrate without a carrier using bumps formed over the TSV.

FIGS. 7a-7h show another process of forming a thin semiconductor substrate without a carrier. In FIG. 7a, a substrate or wafer 150 is made with a semiconductor base material such as silicon, germanium, gallium arsenide, indium phosphide, or silicon carbide. One or more semiconductor die, as described above, are formed on or mounted to substrate 150. Each semiconductor die includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement analog circuits or baseband digital circuits, such as DSP, memory, or other signal processing circuit. The semiconductor die may also contain IPD, such as inductors, capacitors, and resistors, for RF signal processing.

A plurality of TSV 152 is formed in a front surface of substrate 150 by etching or drilling a via through the silicon material of the substrate to a depth of 30-300 μm. The via is filled with Al, Cu, Sn, Ni, Au, Ag, Ti, W, poly-silicon, or other suitable electrically conductive material using PVD, CVD, electrolytic plating, electroless plating process, or other suitable metal deposition process.

An electrically conductive layer 154 is patterned and deposited over substrate 150 and TSV 152. Conductive layer 154 can be one or more layers of Al, Cu, Sn, Ni, Au, Ag, or other suitable electrically conductive material. Conductive layer 154 is formed using PVD, CVD, electrolytic plating, electroless plating process, or other suitable metal deposition process. Conductive layer 154 is a metal pad having electrical connection to the active and passive devices, IPDs, and conductive layers disposed in the semiconductor die. Conductive layer 154 electrically contacts conductive TSV 152.

A dielectric or insulating layer 156 is formed over substrate 150 and conductive layer 154. The dielectric layer 156 can be one or more layers of SiO2, Si3N4, SiON, Ta2O5, ZrO2, Al2O3, polyimide, BCB, PBO, or other material having suitable electrical insulating properties. The dielectric layer 156 is patterned or blanket deposited using PVD, CVD, printing, spin coating, sintering, or thermal oxidation. A portion of dielectric layer 156 is removed by an etching process to expose conductive layer 154.

An electrically conductive layer 158 is patterned and deposited over dielectric layer 156 and conductive layer 154. Conductive layer 158 can be one or more layers of Al, Cu, Sn, Ni, Au, Ag, or other suitable electrically conductive material. Conductive layer 158 is formed using PVD, CVD, electrolytic plating, electroless plating process, or other suitable metal deposition process. Conductive layer 158 operates as a runner or RDL to extend the interconnectivity of conductive layer 154.

A passivation or insulating layer 160 is formed over dielectric layer 156 and conductive layer 158. The passivation layer 160 can be one or more layers of SiO2, Si3N4, SiON, Ta2O5, Al2O3, or other material having insulating and structural properties. The passivation layer 160 is patterned or blanket deposited using PVD, CVD, printing, spin coating, sintering, or thermal oxidation. A portion of passivation layer 160 is removed by an etching process to expose a portion of conductive layer 158 over conductive TSV 152.

Figure 7B:
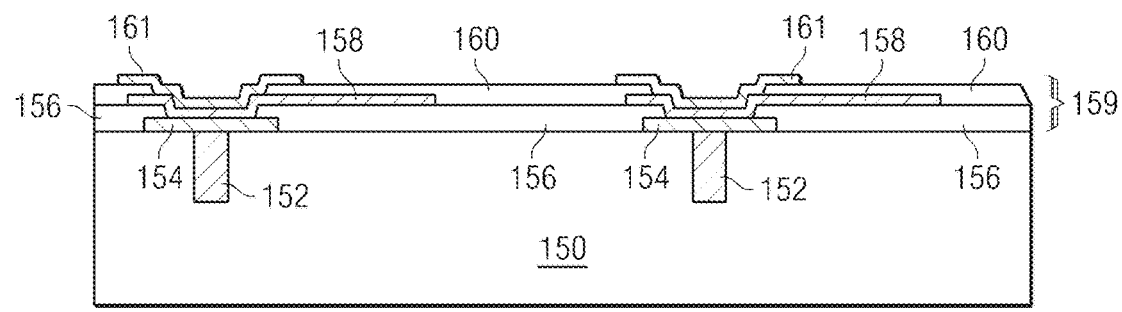

In FIG. 7b, an electrically conductive layer 161 is patterned and deposited over passivation layer 160 and the portion of conductive layer 158 over conductive TSV 152. Conductive layer 161 can be one or more layers of Al, Cu, Sn, Ni, Au, Ag, or other suitable electrically conductive material. Conductive layer 161 is formed using PVD, CVD, electrolytic plating, electroless plating process, or other suitable metal deposition process. Conductive layer 161 operates as a UBM or bump pad for conductive layer 158. UBM 161 can be a multi-metal stack with adhesion layer, barrier layer, and seed or wetting layer. The adhesion layer is formed over conductive layer 158 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 158 and subsequent bumps or other interconnect structure. UBM 161 provides a low resistive interconnect to conductive layer 158, as well as a barrier to solder diffusion and seed layer for solder wettability.

The combination of conductive layers 154 and 158, UBM 161, and insulating layers 156 and 160 constitute a front side interconnect structure 159.

Figure 7C:
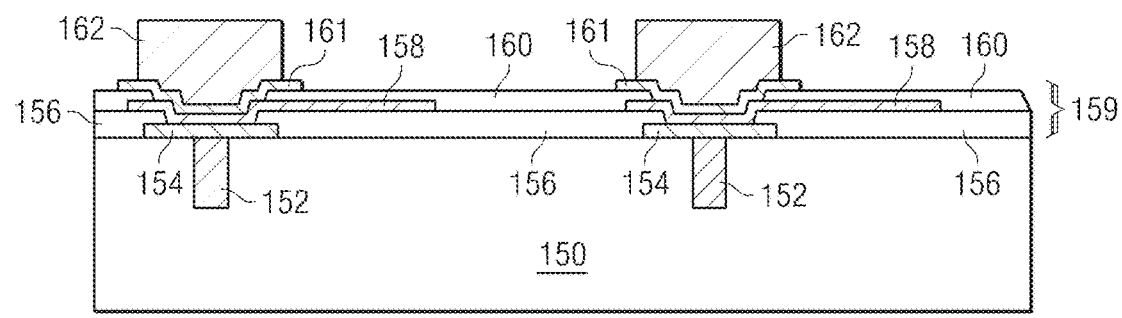

In FIG. 7c, an electrically conductive material is deposited over UBM 161 to form bumps 162 using an evaporation, electrolytic plating, electroless plating, ball drop, or screen printing process. Bumps 162 are positioned directly over conductive TSV 152. The conductive material can be any metal such as Sn, Ni, Au, Ag, Pb, Bi, and alloys thereof, with an optional flux material.

Figure 7D:
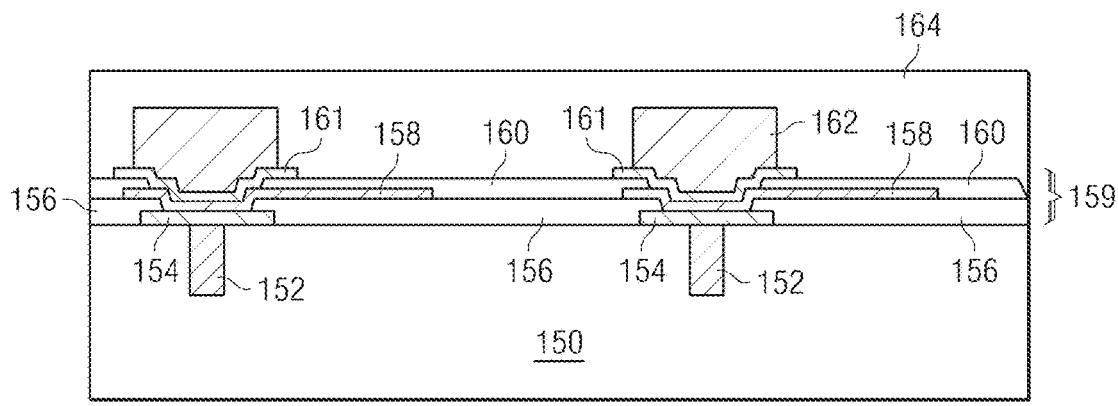

FIG. 7d shows an encapsulant or molding compound 164 deposited over passivation layer 160 and bumps 162 using a paste printing, compressive molding, transfer molding, liquid encapsulant molding, vacuum lamination, or other suitable applicator. Encapsulant 164 can be polymer composite material, such as epoxy resin with filler, epoxy acrylate with filler, or polymer with proper filler. Encapsulant 164 is non-conductive and environmentally protects the semiconductor device from external elements and contaminants.

Figure 7E:
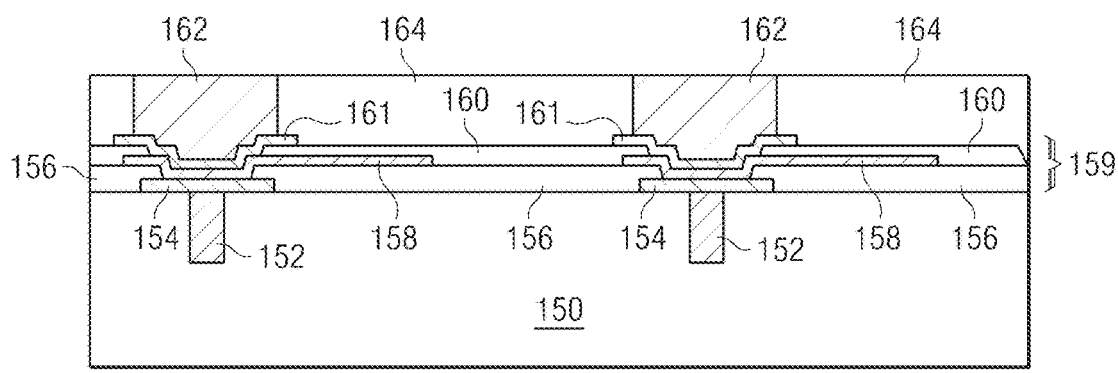

In FIG. 7e, a portion of encapsulant 164 is removed by CMP, mechanical grinding, plasma etching, wet etch, dry etch, or another thinning process to expose bumps 162.

Figure 7F:
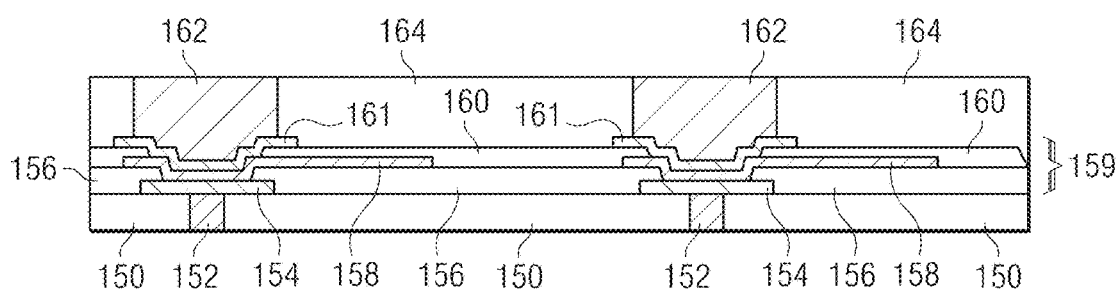
Figure 7G:
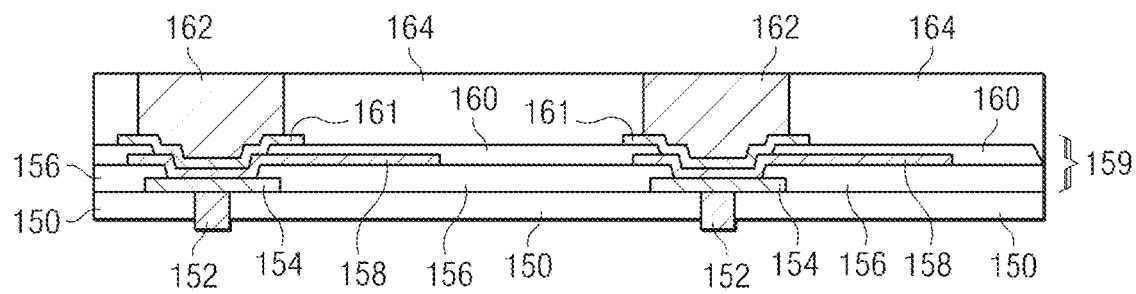

In FIG. 7f, a portion of a back surface of substrate 150 is removed to expose conductive TSV 152. The silicon or other base semiconductor material 150 can be removed by CMP, mechanical grinding, plasma etching, wet etch, dry etch, or another thinning process. A back grinding tape can be used for structural support during the thinning process. The remaining portion of substrate 150 is relatively thin, having a thickness less than 100 µm. Encapsulant 164 provides structural support for the thin substrate 150 during the thinning process, as well as later handling and processing. Encapsulant 164 eliminates the need for a separate wafer carrier. FIG. 7g shows another embodiment with TSV 152 extending or protruding from the back surface of substrate 150 after the thinning process.

Figure 7H:
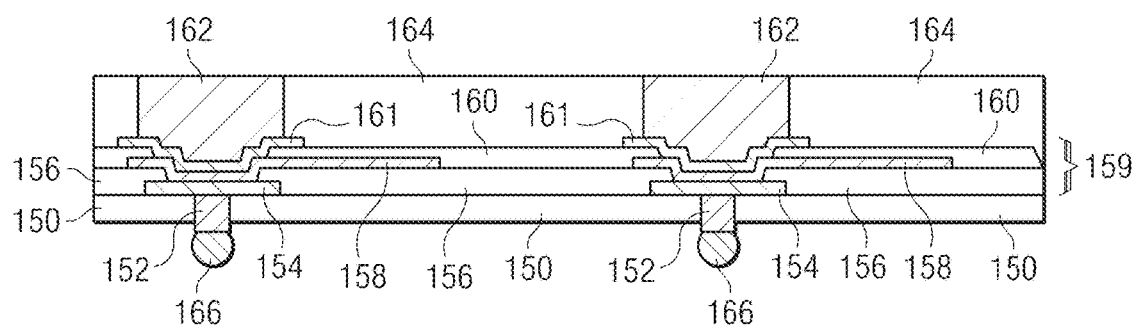

In FIG. 7h, an electrically conductive material is deposited over conductive TSV 152 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 166. In some applications, bumps 166 are reflowed a second time to improve electrical contact to conductive TSV 152. Bumps 166 represent one type of interconnect structure that can be formed over conductive TSV 152. The interconnect structure can also use bond wires, 3-D interconnects, stud bump, micro bump, or other electrical interconnect.

Figure 8:
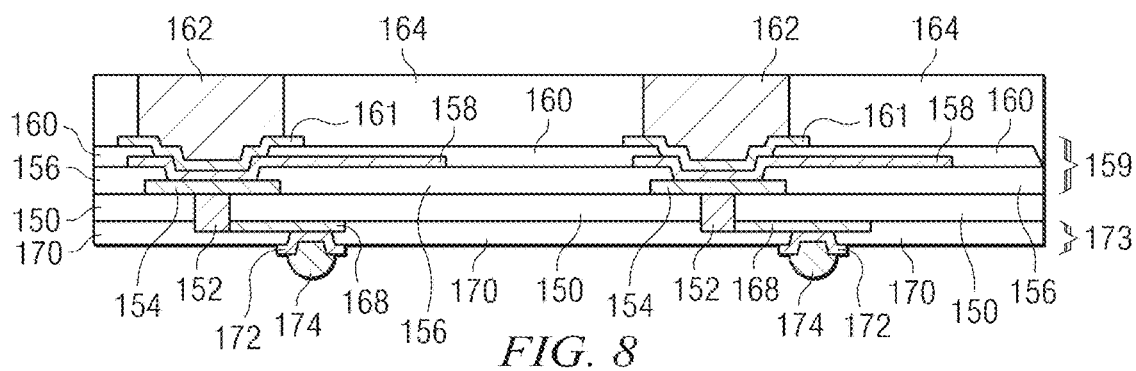
FIG. 8 illustrates forming RDL and bumps on a back surface of the thin substrate.

FIG. 8 shows another embodiment with an electrically conductive layer 168 patterned and deposited over the back surface of substrate 150. Conductive layer 168 can be one or more layers of Al, Cu, Sn, Ni, Au, Ag, or other suitable electrically conductive material. Conductive layer 168 is formed using PVD, CVD, electrolytic plating, electroless plating process, or other suitable metal deposition process. Conductive layer 168 operates as a runner or RDL to extend the interconnectivity of conductive TSV 152.

A passivation or insulating layer 170 is formed over the back surface of substrate 150, TSV 152, and conductive layer 168. The passivation layer 170 can be one or more layers of SiO2, Si$_3$N$_4$, SiON, Ta2O5, Al2O3, or other material having insulating and structural properties. The passivation layer 170 is patterned or blanket deposited using PVD, CVD, printing, spin coating, sintering, or thermal oxidation. A portion of passivation layer 170 is removed by an etching process to expose conductive layer 168.

An electrically conductive layer 172 is patterned and deposited over passivation layer 170 and conductive layer 168. Conductive layer 172 can be one or more layers of Al, Cu, Sn, Ni, Au, Ag, or other suitable electrically conductive material. Conductive layer 172 is formed using PVD, CVD, electrolytic plating, electroless plating process, or other suitable metal deposition process. Conductive layer 172 operates as a UBM or bump pad for conductive layer 168.

The combination of RDL 168, UBM 172, and insulating layer 170 constitute a back side interconnect structure 173.

An electrically conductive material is deposited over UBM 172 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 174. In some applications, bumps 174 are reflowed a second time to improve electrical contact to UBM 172. Bumps 174 represent one type of interconnect structure that can be formed over UBM 172. The interconnect structure can also use bond wires, 3-D interconnects, stud bump, micro bump, or other electrical interconnect.

Figure 9:
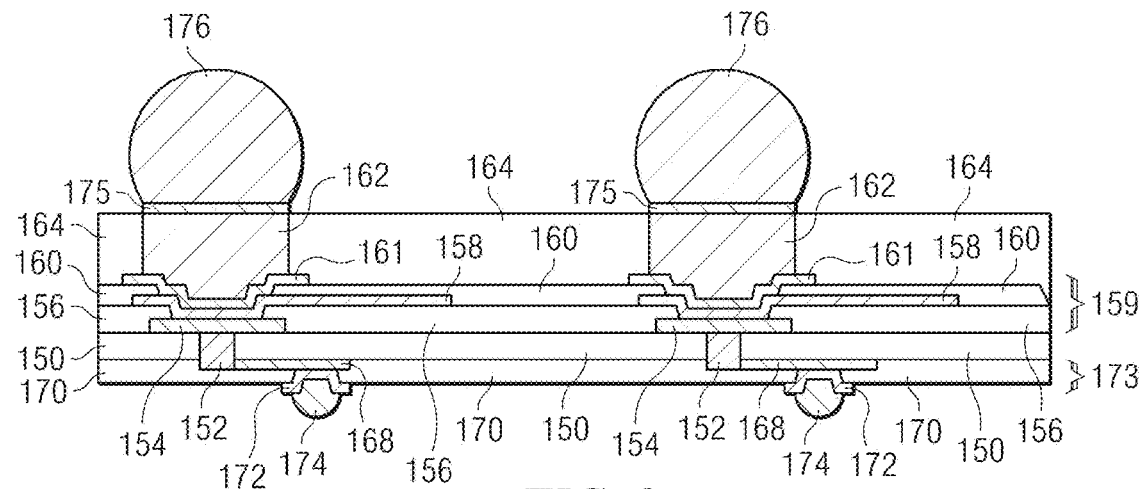
FIG. 9 illustrates forming UBM and bumps on a front surface of the thin substrate.

In FIG. 9, an electrically conductive layer 175 is patterned and deposited over bump 162. Conductive layer 175 can be one or more layers of Al, Cu, Sn, Ni, Au, Ag, or other suitable electrically conductive material. Conductive layer 175 is formed using PVD, CVD, electrolytic plating, electroless plating process, or other suitable metal deposition process. Conductive layer 175 operates as a UBM or bump pad for bump 162.

An electrically conductive material is deposited over UBM 175 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 176. In some applications, bumps 176 are reflowed a second time to improve electrical contact to UBM 175. Bumps 176 represent one type of interconnect structure that can be formed over UBM 175 and bumps 162. The interconnect structure can also use bond wires, 3-D interconnects, conductive, stud bump, micro bump, or other electrical interconnect.

An alternate process of forming a thin semiconductor substrate without a carrier is shown in FIGS. 10a-10e. From the structure set forth in FIGS. 7a and 7b, an electrically conductive material is deposited over UBM 161 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 180. In some applications, bumps 180 are reflowed a second time to improve electrical contact to UBM 161.

Figure 10A:
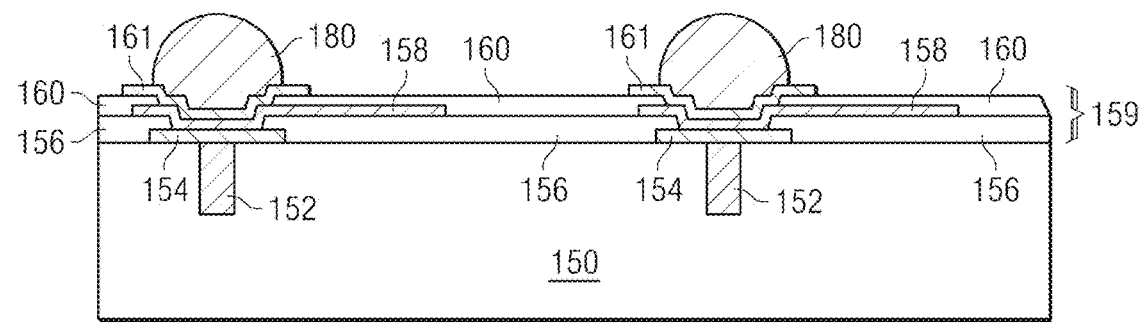
FIGS. 10a-10e illustrate an alternate process of forming a thin semiconductor substrate without a carrier using bumps on the front surface.
Figure 10B:
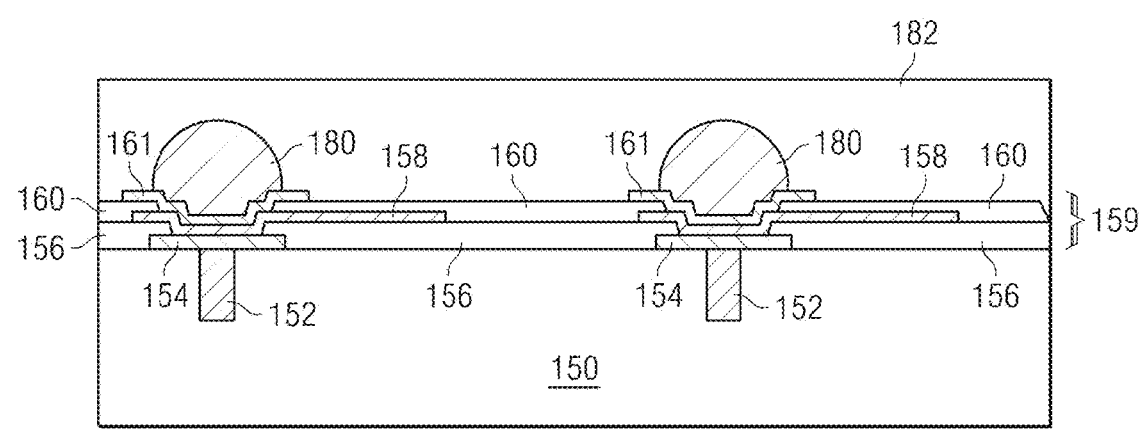

FIG. 10b shows an encapsulant or molding compound 182 deposited over passivation layer 160 and bumps 180 using a paste printing, compressive molding, transfer molding, liquid encapsulant molding, vacuum lamination, or other suitable applicator. Encapsulant 182 can be polymer composite material, such as epoxy resin with filler, epoxy acrylate with filler, or polymer with proper filler. Encapsulant 182 is non-conductive and environmentally protects the semiconductor device from external elements and contaminants.

Figure 10C:
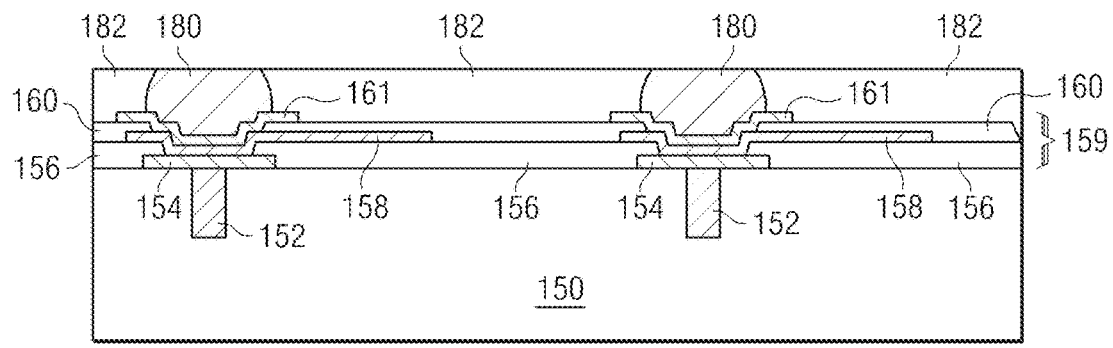

In FIG. 10c, a portion of encapsulant 182 is removed by CMP, mechanical grinding, plasma etching, wet etch, dry etch, or another thinning process to expose bumps 180.

Figure 10D:
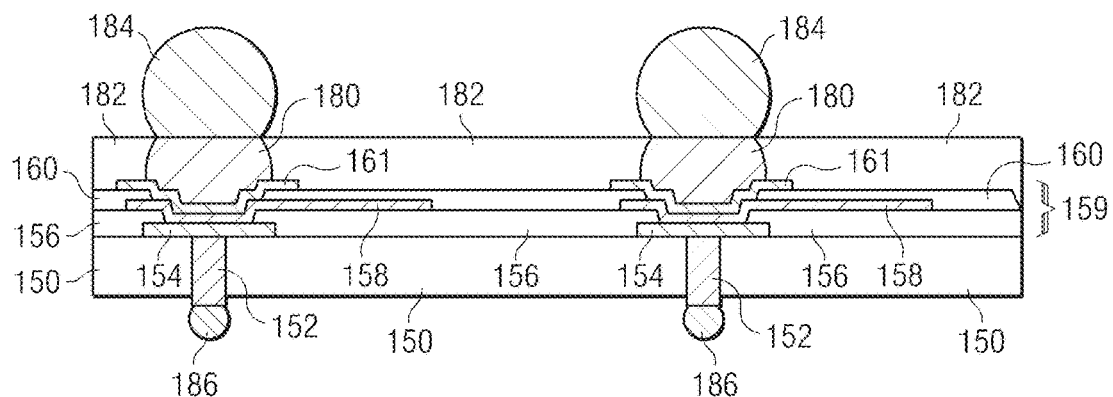

In FIG. 10d, a portion of substrate 150 is removed to expose conductive TSV 152. The silicon or other base semiconductor material 100 can be removed by CMP, mechanical grinding, plasma etching, wet etch, dry etch, or another thinning process. A back grinding tape can be used for structural support during the thinning process. The remaining portion of substrate 150 is relatively thin, having a thickness less than 100 µm. Encapsulant 182 provides structural support for the thin substrate 150 during the thinning process, as well as later handling and processing. Encapsulant 182 eliminates the need for a separate wafer carrier.

An electrically conductive material is deposited over bump 180 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 184. In some applications, bumps 184 are reflowed a second time to improve electrical contact to bumps 180. Bumps 184 represent one type of interconnect structure that can be formed over bumps 180. The interconnect structure can also use bond wires, 3-D interconnects, stud bump, micro bump, or other electrical interconnect.

An electrically conductive material is deposited over conductive TSV 152 using an evaporation, electrolytic plating, electroless plating, ball drop, or screen printing process. The conductive material can be any metal such as Sn, Ni, Au, Ag, Pb, Bi, and alloys thereof, with an optional flux material. The conductive material is reflowed by heating the material above its melting point to form spherical balls or bumps 186. In some applications, bumps 186 are reflowed a second time to improve electrical contact to conductive TSV 152. Bumps 186 represent one type of interconnect structure that can be formed over conductive TSV 152. The interconnect structure can also use bond wires, 3-D interconnects, stud bump, micro bump, or other electrical interconnect.

Figure 10E:
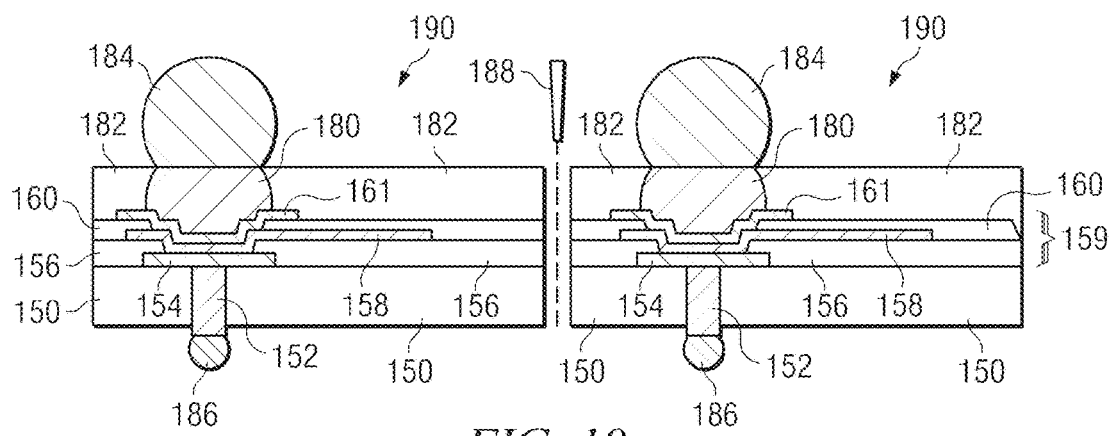
Figure 11:
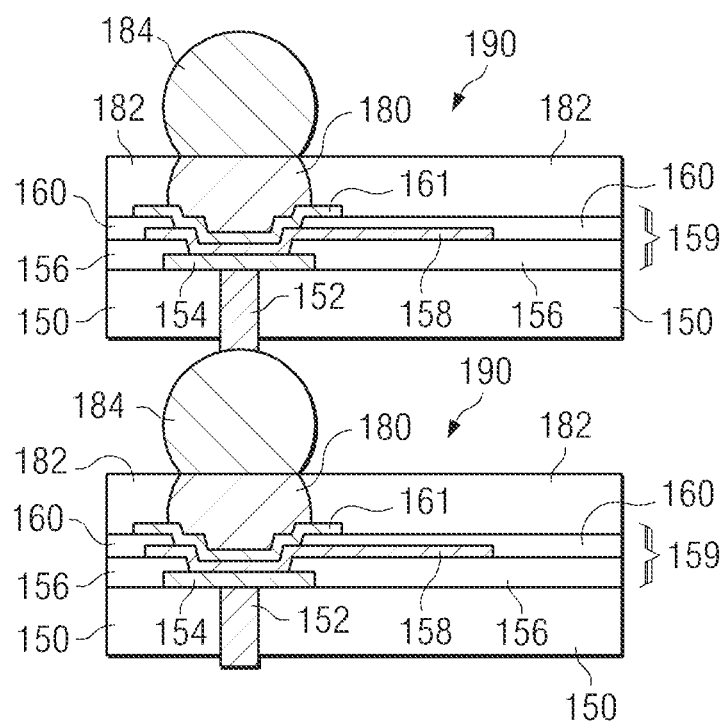
FIG. 11 illustrates stacking the thin substrate packages.

Semiconductor substrate 150 is singulated in FIG. 10e using a laser cutting device or saw blade 188 into individual semiconductor packages 190. FIG. 11 shows two stacked semiconductor packages 190 with a vertical interconnect structure including bumps 184 and 180, UBM 161, RDL 158, conductive layer 154, and TSV 152.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    forming a conductive via partially through the semiconductor die and exposed at a first surface of the semiconductor die;
    forming a first redistribution layer over the first surface of the semiconductor die and coupled to the conductive via;
    forming a first solder bump over the first redistribution layer, wherein the first solder bump is electrically coupled to the conductive via through the first redistribution layer;
    depositing an encapsulant over the first surface of the semiconductor die to completely cover the first redistribution layer and first solder bump;
    removing a portion of the semiconductor die opposite the first surface after depositing the encapsulant to expose the conductive via and create a second surface of the semiconductor die;
    forming a second redistribution layer over the second surface of the semiconductor die and coupled to the conductive via; and
    forming a second solder bump over the second redistribution layer, wherein the second solder bump is electrically coupled to the conductive via through the second redistribution layer.

2. The method of claim 1, further including forming the second solder bump laterally offset from the conductive via.

3. The method of claim 1, further including forming the first solder bump laterally offset from the conductive via.

4. The method of claim 1, further including forming a third solder bump directly on the first solder bump over the encapsulant.

5. A method of making a semiconductor device, comprising:
    providing a substrate;
    forming a conductive via partially through the substrate;
    forming a first redistribution layer over a first surface of the substrate;
    forming a first bump over the first surface of the substrate with the first redistribution layer between the conductive via and first bump;
    depositing an encapsulant over the first surface of the substrate covering the first bump and first redistribution layer;
    removing a portion of the substrate opposite the encapsulant to expose the conductive via;
    forming a second redistribution layer over a second surface of the substrate after removing the portion of the substrate; and
    forming a second bump over the second surface of the substrate with the second redistribution layer between the conductive via and second bump.

6. The method of claim 5, further including forming the second bump laterally offset from the conductive via.

7. The method of claim 5, further including forming the first bump laterally offset from the conductive via.

8. The method of claim 5, further including forming a third bump over the first bump and encapsulant.

9. The method of claim 5, further including forming an interconnect structure over the first surface of the substrate prior to forming the first bump.

10. The method of claim 5, wherein the substrate includes a semiconductor die.

11. A method of making a semiconductor device, comprising:
    providing a substrate;
    forming a conductive via partially through the substrate;
    forming a first interconnect structure over a first surface of the substrate;
    depositing an encapsulant over the first surface of the substrate to cover the first interconnect structure;
    removing a portion of the substrate to expose the conductive via after depositing the encapsulant; and
    forming a second interconnect structure over a second surface of the substrate opposite the first surface of the substrate.

12. The method of claim 11, wherein the first interconnect structure includes a solder bump.

13. The method of claim 11, wherein the second interconnect structure includes a solder bump.

14. The method of claim 11, further including forming the first interconnect structure laterally offset from the conductive via.

15. The method of claim 11, further including forming the second interconnect structure laterally offset from the conductive via.

16. The method of claim 11, wherein the substrate includes a semiconductor die.

* * * * *